United States Patent [19]

Farrow

[11] Patent Number: 4,578,644
[45] Date of Patent: Mar. 25, 1986

[54] METHOD AND APPARATUS FOR TESTING THE PRESENCE OF MAGNETIC STORAGE MEDIUM ON A GIVEN SIDE OF A TAPE

[75] Inventor: Robert I. Farrow, Burlington, N.C.

[73] Assignee: American Multimedia, Inc., Burlington, N.C.

[21] Appl. No.: 540,074

[22] Filed: Oct. 7, 1983

[51] Int. Cl.⁴ ............................................. G01R 33/12
[52] U.S. Cl. ...................................... 324/212; 360/25; 360/31
[58] Field of Search ......................... 324/206, 210, 212; 360/25, 31; 369/53, 58

[56] References Cited

U.S. PATENT DOCUMENTS

| | | | |
|---|---|---|---|
| 2,870,430 | 1/1959 | Hancock | 360/31 X |
| 3,015,062 | 12/1961 | George et al. | 324/206 |
| 3,066,253 | 11/1962 | Bowers | 324/206 |
| 3,185,922 | 5/1965 | Wherry . | |
| 3,217,111 | 11/1965 | Namenyi-Katz | 360/31 X |
| 3,535,622 | 10/1970 | Cannon et al. . | |
| 3,562,635 | 2/1971 | Parker . | |
| 3,564,160 | 2/1971 | Temes | 360/31 X |
| 3,873,912 | 3/1975 | Mori et al. | 324/206 |
| 4,253,122 | 2/1981 | Tabata | 360/31 X |
| 4,255,807 | 3/1981 | Cosby . | |

*Primary Examiner*—Gerard R. Strecker
*Attorney, Agent, or Firm*—W. Thad Adams, III

[57] ABSTRACT

A magnetic storage indicator (40) is disclosed for use on a recording tape processing apparatus, such as a cassette winder (10). Magnetic storage indicator (40) comprises a recording head (50) and a downstream playback head (51). Signals received at the playback head (51) are transmitted to a pre-amplifier (60), an equalization circuit (70) and a record amplifier (80) and then back to the recording head (50) where the amplified signal is recorded onto the moving tape. If the oxide layer is on the side of the tape in contact with the record head (50) and the playback head (51) a feedback loop is completed, causing the circuit to oscillate. This condition is transmitted to a light emitting diode (48) indicating that the tape is properly wound.

4 Claims, 4 Drawing Figures

METHOD AND APPARATUS FOR TESTING THE PRESENCE OF MAGNETIC STORAGE MEDIUM ON A GIVEN SIDE OF A TAPE

TECHNICAL FIELD AND BACKGROUND OF THE INVENTION

This invention relates to a method and apparatus for determining the presence of a magnetic storage medium such as an iron oxide or chromium oxide layer on a tape such as audio or video recording tape. Specifically the method and apparatus according to the embodiment disclosed in this application is used to ensure that tape which is wound on a supply package and loaded on a high speed cassette winder has been wound with the oxide layer on the proper side of the tape to be correctly wound into the cassette for future playback and recording. While the invention disclosed herein is discussed with specific reference to a high speed cassette loader, it also has application on tape winders, slitters and high speed tape duplicators.

In order for a cassette to be usable, the tape must be properly oriented so that the oxide layer faces to the outside so it can come into contact with the recording and playback heads of a tape deck. High speed cassette loaders are capable of loading an empty cassette with either blank or prerecorded tape in only a few seconds. Therefore, placing an improperly wound supply package of tape on a cassette winder can very quickly waste a considerable number of cassettes and a substantial amount of machine productivity.

With modern audio and video recording tape, it is difficult to determine visually whether the tape is oriented correctly side-to-side. In order to put as much tape as possible in a cassette, the tape itself is made ultra-thin. Advances in oxide coatings have reduced the thickness of the oxide layer to the point where it may be substantially transparent. Therefore, a highly polished oxide layer on an ultra-thin transparent tape may look virtually the same on both sides.

SUMMARY OF THE INVENTION

Therefore, it is an object of the invention to provide a method and apparatus to determine the presence of a magnetic storage medium such as an iron oxide coating on a tape.

It is another object of the present invention to provide a method and apparatus for automatically determining whether the tape is being processed with correct side-to-side orientation.

It is another object of the present invention to provide a method and apparatus for ensuring correct loading of tape on a supply package into cassettes being loaded on a high-speed cassette loader.

It is yet another object of the present invention to provide a method and apparatus for determining the presence of a magnetic storage medium on a tape by using the magnetic storage medium itself as a part of an electronic feedback loop.

These and other objects and advantages of the present invention are achieved by providing an apparatus for testing tape for the presence of a magnetic storage medium on a given side thereof which comprises means for scanning a moving tape for the presence of a signal representing a minimum amount of magnetic noise. Means are provided for amplifying the signal and recording the amplified signal on the tape upstream of the scanning means.

Means are provided for repeatedly amplifying the signal and recording the signal on the tape upstream of the scanning means until a pre-determined signal level is produced on the tape and scanned by the scanning means.

Means are provided for indicating the presence or the absence of the pre-determined signal level. In accordance with the method disclosed herein, a moving tape is scanned for the presence of a signal representing a minimum amount of magnetic noise, amplifying the signal and recording the amplified signal on the tape upstream of the scanning step. The scanning, amplifying and recording takes place repeatedly until a pre-determined signal level is produced on the tape and scanned.

According to one embodiment of the invention, a magnetic signal is initially applied to the tape. In another embodiment of the invention, the method relies on ambient, low level noise which is inherently present on all recording tape.

BRIEF DESCRIPTION OF THE DRAWINGS

Some of the objects of the invention have been set forth above. Other objects and advantages of the invention will appear as the description of the invention proceeds, when taken in conjunction with the following drawings, in which.

DESCRIPTION OF THE PREFERRED EMBODIMENT

Figure 1:
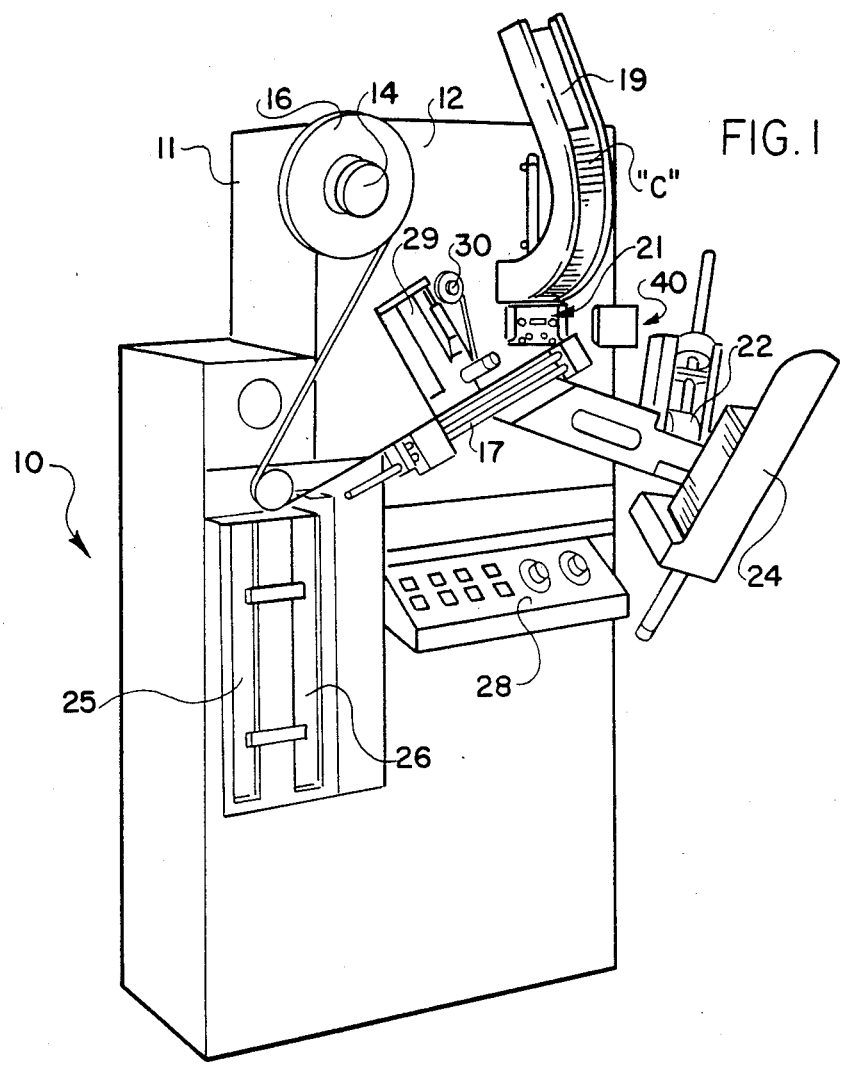
FIG. 1 is a perspective view of a high speed audio cassette tape winder with a magnetic storage indicator according to the present invention thereon.

Referring now specifically to the drawings, an audio tape cassette winder is shown and generally designated at broad reference numeral 10. Winder 10 comprises a console 11 within which are mounted the major electrical, pneumatic and mechanical operation parts. Console 11 has a front cover 12 which supports a rotatably driven audio tape supply reel 14 onto which is wound a supply of magnetic tape 16; a tape leader extractor assembly 17; a cassette supply tray 19 which holds a plurality of cassettes "C"; a cassette winding spindle 21; a defective cassette rejector assembly 22; and a stacking trough 24 for finished cassettes. A pair of vacuum take-up columns 25 and 26 selectively exert a vacuum force on the audio tape to positively control tape tension as it is wound from the supply reel 14 and onto cassette "C" by cassette winding spindle 21.

A control panel 28 enables the operator to manipulate various functions of the winder 10. A tape splicing apparatus 29 is mounted on front panel 12 and dispenses adhesive splicing tape from a supply spool 30 at the appropriate time to splice a segment of audio tape between short lengths of leader tape which is attached to rotating drums within cassette "C".

Winder 10 also includes an electronic magnetic storage indicator 40 which is positioned on front cover 12 proximate the cassette winding spindle 21.

Supply reel 14 may be wound with unrecorded audio tape which is then used to produce "blank" cassettes to be used for later recording. Alternatively, supply reel 14 may be wound with tape containing a series of identical recordings of music, speech or other audio signals. A low frequency "Q" signal is recorded onto the audio tape between each album and indicates the end of one album and the beginning of the next.

Supply reel 14 holds a relatively large amount of tape sufficient to load a large number of cassettes. Once the supply reel 14 containing the tape 16 has been loaded onto the winder 10, the machine is started and operates unattended until the supply of tape 16 is exhausted. Therefore, it is important to detect whether the supply reel 14 has been properly wound with tape 16. If, for some reason, the tape has been wound onto supply reel 14 wrong side out, the cassettes which are loaded with the tape will be unusable.

Figure 2:
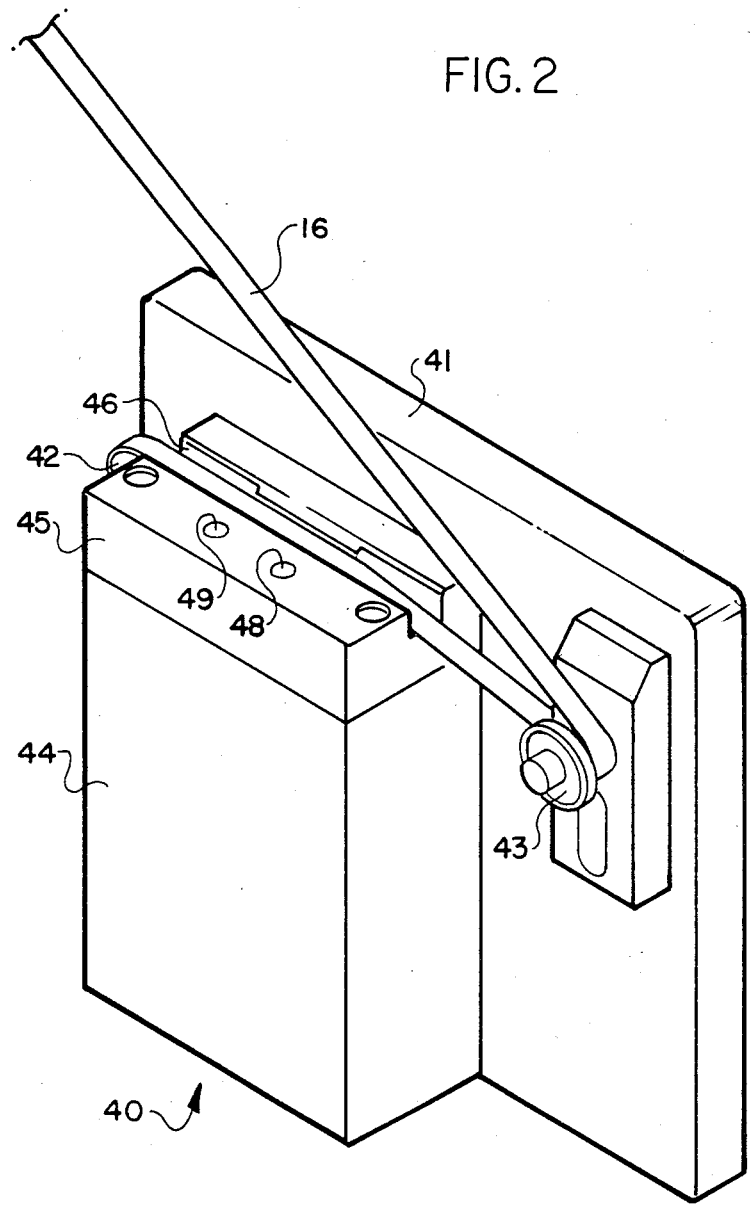
FIG. 2 is a enlarged, perspective view of the housing of the magnetic storage indicator.

Referring to FIG. 2, magnetic storage indicator 40 comprises a mounting 41 having a pair of spaced apart, rotatably mounted spindles 42 and 43. Electronic components which will be described below are contained in a components housing 44. A head assembly 45 is attached to the top of components housing 44 and contains an elongate tape-receiving slot 46. The bottom of this slot is slightly above the level at which tape 16 would ordinarily pass under spindles 42 and 43.

Therefore, the tape is brought into close contact with recording and playback heads (not shown in FIG. 2) positioned in the bottom of slot 46. A pair of indicator lights 48 and 49 are positioned on the top of head 45 and indicate, respectively, the presence or absence of a magnetic storage medium on the proper surface of tape 16.

In order to test for the presence of a magnetic storage medium on the tape, the leading end of the tape 16 from supply reel 14 is threaded under spindles 42 and 43. When the machine is activated, the test occurs and the indicator light 48 or 49 indicates the presence or absence of magnetic storage medium on the proper side of the tape. In addition, if light 48 indicates presence of magnetic storage medium on the proper side of tape 16, the winder is commanded to begin winding cassettes.

Figure 3:
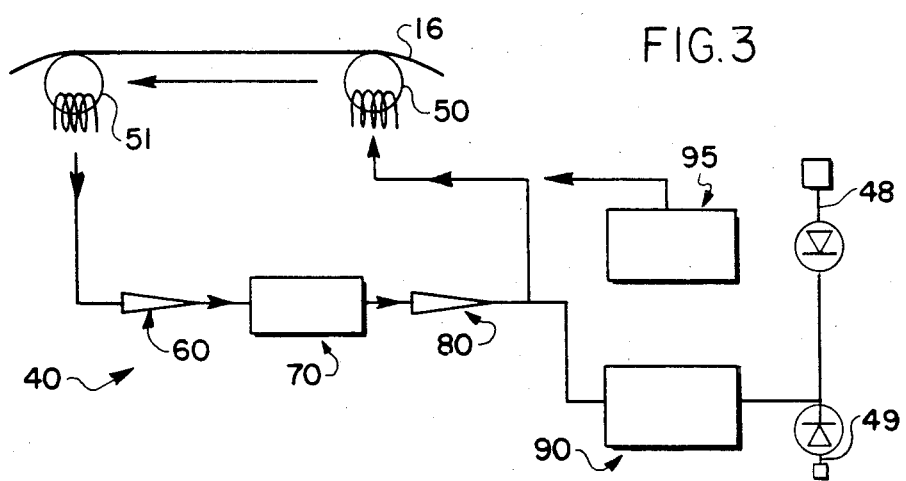
FIG. 3 is a simplified circuit diagram of the magnetic storage indicator.

Referring now to FIG. 3, magnetic storage indicator 40 comprises a record head 50 and a playback or scanning head 51. Signals received from tape 16 by playback head 51 are transmitted in series to a pre-amplifier 60, an equalization circuit 70, and a record amplifier 80. The output from record amplifier 80 is transmitted to record head 50 where the amplified signal is recorded on the moving tape 16 upstream from playback head 51. The output from record amplifier 80 is also transmitted to a level detector 90. Depending on the signal level, indicator 48 or 49 is activated. Flux level is controlled by a bias current 95.

Figure 4:
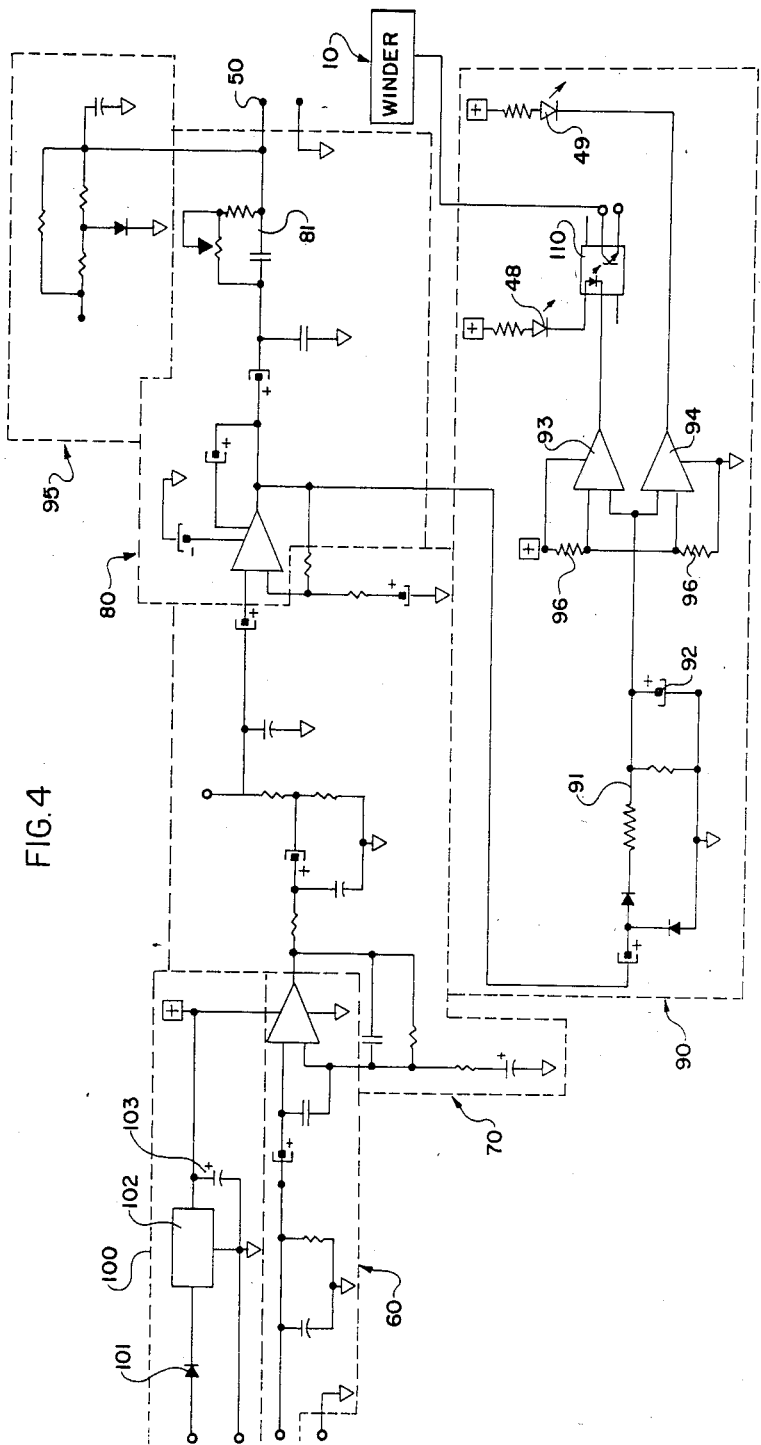
FIG. 4 is a circuit diagram of the magnetic storage indicator.

Referring now to FIG. 4, the circuit will be explained in more detail. Magnetic storage indicator 40 includes a power supply regulator 100 which accepts a direct current input in the range of 7–35 volts. Polarity protection is provided by an input diode 101. Voltage regulator 102 charges a capacitor 103 to five volts which powers the magnetic storage indicator 40. The input pre-amplifier circuit 60 receives an input signal from playback head 51. The voltage of this signal is substantially increased by pre-amplifier 60 and is transmitted to equalization circuit 70 where the amplified signal is filtered to exclude frequencies outside 50 Hz to 10 KHz. The amplified and equalized signal is then transmitted to the record amplifier 80 where it is again amplified and transmitted to the record head 50 through an adjustable resistance-capacitance network 81 which acts as a record level control. Output from the R-C network 81 is summed with the output of the bias circuit 95 to place the output signal from record amplifier 80 into the linear portion of the tapes' magnetization curve at the record head 50. Of course, the bias level applied by bias circuit 95 varies depending upon the type of tape 16 being wound.

The output signal from record amplifier 80 is also transmitted to the level detector 90. Level detector 90 includes a modified voltage doubler 91 which charges capacitor 92 which is connected to a pair of operational amplifiers 93 and 94. Capacitor 92 is charged to a voltage that is proportional to the signal present in the output stage of record amplifier 80. Amplifier 93 contains four voltage comparators, two of which are used in this section. A fixed reference voltage is created by a resistive voltage divider 96 to amplifiers 93 and 94. If the signal level is below the reference level, the output from amplifier 94 is low. This causes indicator light 49, comprising a red light emitting diode, to glow. If the signal level rises above the reference level, this indicator goes off. Simultaneously, the output from amplifier 93 goes low causing indicator light 48 to glow green, which in turn activates an opto-coupler 110. Opto-coupler 110 allows the magnetic storage indicator 40 to be connected to the tape winding function of the winder 10. Therefore, winder 10 may be activated by the activation of the green LED 48.

Referring again to FIG. 3, it can be seen that the circuit 40, together with the tape 16, comprises a continuous feedback loop. Its operation can best be explained by first providing an analogy. Consider a more common type of feedback which is quite often present in public address systems where excessive gain causes the sound waves generated by loudspeakers to be picked up by the microphone and reamplified back through the system. This usually causes a squealing noise as the feedback is reamplified at the microphone and transmitted back into the sound amplification system. This feedback loop is present only because of the air between the speaker and the microphone which permits the sound waves to travel the distance between the two. Put the microphone and speaker in an airless environment and the feedback loop is broken and no feedback occurs.

An analogous situation is present in this invention. All system amplifiers produce a small amount of random noise. Also, virtually any tape, no matter how carefully manufactured, contains irregularities in the oxide layer which result in high frequency, short wave length noise. This characteristic hissing sound is usually quite detrimental to sound reproduction quality and in fact is the subject of many types of noise reduction systems which compand the signal to reduce the hiss below the audible level. In this invention, the hiss, either applied by the system amplifier or naturally present on the tape, is used to help start circuit 40.

As tape passes across the record head 50, small amounts of random noise may be recorded on the tape if the naturally occurring noise is not considered sufficient. The tape proceeds downstream to the pickup head 51 which picks up the noise and applies it to pre-amplifier 60. From there, the signal is carried in the loop in a much amplified condition back to record head 50 where it is reapplied to tape 16. This process occurs many times a second. In order for this process to continue and the levels to rise above an ambient noise level, certain conditions must exist. The system's amplifiers 60 and 80 must have a controlled gain at the frequencies of interest. If the tape is properly oriented with the oxide layer against the record head 50 and playback head 51, the system very quickly oscillates as the signal is repeatedly amplified and reapplied to the tape. This is the proper condition and one which generates an output signal sufficient to activate the green indicator LED 48. However, assume that the tape is flipped over so that the oxide layer does not run across record head 50 and playback head 51. Record head 50 may nevertheless record some ambient noise on the oxide layer through the thickness of the tape. However, the playback head 51 suffers from severe "spacing" loss created by the airgap between the tape and the pole pieces of playback head 51 according to the formula:

Loss in db = 54.6(d/wavelength)

Within the frequencies of interest, the spacing loss caused by the thickness of the tape base which separates the playback head 51 from the oxide layer is large enough to cause a large reduction in playback level. Therefore, the spacing of the oxide layer away from the playback head 51 acts in much the same way as removing air from between an amplifier and microphone in the analogous situation described above.

A method and apparatus for testing the presence of magnetic storage medium on a tape is described above. Various details of the particular embodiment described above may be changed without departing from the scope of the invention. The invention is defined by the claims.

I claim:

1. A method for testing tape for the presence of a magnetic storage medium on a given side thereof, comprising the steps of:
   (a) scanning a moving tape for the presence of a minimum amount of ambient noise naturally present on any recording tape resulting from inherent irregularities in oxide layer characteristics to produce a noise signal, and when said noise is present;
   (b) amplifying said noise signal;
   (c) recording said amplified noise signal on said tape upstream of the scanning step;
   (d) simultaneously detecting said amplified noise signal;
   (e) repeating steps (a), (b), (c) and (d) above, for a pre-determined period of time or until a pre-determined signal level is produced on the tape indicating the presence of a magnetic storage medium on a given side thereof; and
   (f) indicating upon the detection of said pre-determined signal level within said predetermined period of time, the presence of a magnetic storage medium on a given side of said moving tape, or, when said predetermined signal level is not detected on said tape within said predetermined period of time, indicating the absence of said magnetic storage medium on said given side of said moving tape.

2. A method according to claim 1, wherein the step of amplifying said noise signal comprises the steps of:
   (a) pre-amplifying said noise signal to boost the gain of said noise signal and exclude noise frequency outside the range of 50 Hz to 10 KHz; and
   (b) amplifying the frequency limited noise signal within the bandwidth passed by the pre-amplifying step.

3. A method according to claim 1, and including the additional step of biasing the amplified noise signal to place the signal level in the linear portion of the tape's magnetization curve.

4. An apparatus for testing tape for the presence of magnetic storage medium on a given side thereof, comprising:
   (a) scanning means for scanning a moving tape for the presence of a minimum amount of magnetic noise naturally present on any recording tape resulting from inherent irregularities in magnetic storage medium characteristics to produce a noise signal;
   (b) feedback loop means coupled to said scanning means, said feedback loop means including amplifying means for amplifying the noise signal and recording means for recording the amplified noise signal upstream of said scanning means, for repeatedly amplifying said noise signal and recording said noise signal on the tape for a predetermined period of time or until a predetermined signal level is produced on the tape while said tape is scanned by said scanning means;
   (c) means coupled to said amplifying means for detecting the amplified noise signal from said amplifying means; and
   (d) means coupled to said detection means for indicating the detection of said predetermined signal level within said predetermined period of time to provide a indication of the presence of a magnetic storage medium on the side of said tape contacted by said scanning means, and, for indicating lack of detection of said predetermined signal level within said predetermined period of time to provide an indication of the absence of said magnetic storage medium on the side of said tape contacted by said scanning means.

* * * * *